United States Patent
Mergenthaler

(10) Patent No.: US 6,927,982 B2
(45) Date of Patent: Aug. 9, 2005

(54) METHOD OF CONNECTING A DEVICE TO A SUPPORT, AND PAD FOR ESTABLISHING A CONNECTION BETWEEN A DEVICE AND A SUPPORT

(75) Inventor: Egon Mergenthaler, München (DE)

(73) Assignee: Infineon Technologies AG, Munich (DE)

(*) Notice: Subject to any disclaimer, the term of this patent is extended or adjusted under 35 U.S.C. 154(b) by 200 days.

(21) Appl. No.: 10/241,546

(22) Filed: Sep. 11, 2002

(65) Prior Publication Data

US 2003/0046809 A1 Mar. 13, 2003

(30) Foreign Application Priority Data

Sep. 11, 2001 (DE) .......................................... 101 44 704

(51) Int. Cl.[7] .............................. H05K 7/10; H05K 7/12
(52) U.S. Cl. ........................ 361/767; 361/776; 29/850
(58) Field of Search ................................ 361/776, 767; 174/262–264; 435/5–7, 287.2; 438/106–109; 257/775–777; 428/209–210; 29/850

(56) References Cited

U.S. PATENT DOCUMENTS

| | | | |
|---|---|---|---|
| 5,818,700 A | | 10/1998 | Purinton |
| 5,994,766 A | * | 11/1999 | Shenoy et al. ............... 257/659 |
| 6,025,647 A | * | 2/2000 | Shenoy et al. ............... 257/775 |
| 6,166,444 A | * | 12/2000 | Hsuan et al. ................ 257/777 |
| 6,225,143 B1 | * | 5/2001 | Rao et al. .................... 438/106 |
| 6,250,984 B1 | * | 6/2001 | Jin et al. ........................ 445/51 |
| 6,277,318 B1 | * | 8/2001 | Bower et al. ............... 264/346 |
| 6,346,189 B1 | * | 2/2002 | Dai et al. .................... 205/766 |
| 6,536,106 B1 | * | 3/2003 | Jackson et al. ............... 29/872 |

FOREIGN PATENT DOCUMENTS

| | | |
|---|---|---|
| DE | 44 24 753 A1 | 1/1996 |
| EP | 1 096 533 A1 | 5/2001 |
| WO | WO 00/30141 | 5/2000 |
| WO | WO 01/61753 A1 | 8/2001 |

* cited by examiner

Primary Examiner—Kamand Cuneo
Assistant Examiner—Tuan Dinh
(74) Attorney, Agent, or Firm—Laurence A. Greenberg; Werner H. Stemer; Ralph E. Locher

(57) ABSTRACT

In a method of connecting a device to a support, in which method the device comprises at least a first terminal region, and in which method the support comprises at least a second terminal region, electrically conductive, flexible microparticles are initially produced on the first terminal region and/or on the second terminal region. Subsequently the terminal regions are connected via the electrically conductive, flexible microparticles.

18 Claims, 2 Drawing Sheets

METHOD OF CONNECTING A DEVICE TO A SUPPORT, AND PAD FOR ESTABLISHING A CONNECTION BETWEEN A DEVICE AND A SUPPORT

BACKGROUND OF THE INVENTION

1. Field of the Invention

The present invention generally relates to a method of connecting a device to a support, and relates to a terminal pad, or pad, for such a connection, and relates in particular to a method of connecting and to a pad for connecting which enable a flexible interconnection between the components to be connected. In particular, the present invention relates to a method of connecting chip elements to a printed circuit board, and to a pad for such a connection.

2. Description of the Background Art

The cost at the so-called back-end of line (BEOL) in chip production for housing the chips may be reduced by a factor of 10 per chip if the chip is bonded directly onto the printed circuit board or onto the board.

The disadvantage of this direct application of the chips to a printed circuit board exists in the differing expansion coefficients of the materials used, that is in a lack of adjustment of the expansion coefficients (CTE mismatch; CTE=coefficient of temperature expansion). Adhesion problems due to shearing forces occur in the temperature range between −65° C. and +150° C.

The manufacturing processes just described are also referred to as "wafer level package" or "wafer scale assembly". The important, cost-saving step in the production is achieved by replacing the serial process of housing chips that have already been diced by a parallel process to be carried out on the complete wafer, in which suitable connection elements for providing contact to the circuit board (PCB=printed circuit board) are used. Various connecting techniques have been known by means of which the interfering adhesion problems which occur in the above-mentioned temperature range from −65° C. to +150° C. and are due to the occurring shearing forces are to be avoided. The most current techniques will be briefly explained below.

In accordance with a first technique, the pads of the chip (chip contacts) on the wafer are covered with solder droplets which establish a rigid contact with the printed circuit board by means of a heating step, as is used, for example, in flip-chip technology.

With an increase in the chip size, however, the above-mentioned shearing forces make themselves felt increasingly. A known concept for avoiding the occurring shearing forces due to the thermal mismatch is to provide an elastic dielectric layer arranged between the chip and the board, electrical contact being made via one or several conductors vapor-deposited onto the flexible dielectric.

This approach, however, is disadvantageous in that, in addition, the dielectric layer is to be provided which further must be provided with the corresponding contacting for connecting the pads on the chip and on the board, which entails increased outlay and cost.

SUMMARY OF THE INVENTION

It is the object of the present invention to provide a simplified method of connecting a device to a support, and to provide a pad for such a connection, by means of which adhesion problems due to instances of thermal mismatch may be avoided.

The present invention is a method for connecting a device to a support, the device having at least a first terminal region, and the support having at least a second terminal region. Electrically conductive, flexible microparticles are produced in the first terminal region and/or on the second terminal region, and the first terminal region and the second terminal region are connected via the electrically conductive, flexible microparticles.

The present invention is a method for connecting a device to a support via a redistribution layer arranged on the device, the device including at least a device terminal region. The redistribution layer has at least a first terminal region connected to the device terminal region, and the support has at least a second terminal region. In the method, electrically conductive, flexible microparticles are produced in the first terminal region and/or in the second terminal region, and the first terminal region and the second terminal region are connected via the electrically conductive, flexible microparticles.

The present invention is a pad for producing a connection between a device and a support, the pad being associated with the device or the support, a plurality of electrically conductive, flexible microparticles being arranged on the pad.

In accordance with an aspect of the present invention, a device having one or several pads in accordance with the present invention is also provided. In accordance with a further aspect, a device having a redistribution layer is provided, at least one pad in accordance with the present invention being provided on the redistribution layer. In accordance with a further aspect of the present invention, a support for receiving a device is provided, which support comprises one or several pads in accordance with the present invention.

In accordance with a first preferred embodiment of the present invention, the terminal regions or pads to be connected are each provided with the electrically conductive, flexible microparticles, so that the microparticles intermesh in the manner of a velcro fastening as they are being connected, whereby a detachable connection is created.

In another embodiment of the present invention, at least the exposed ends of the microparticles are provided with a conductive layer, e.g. with a metalization or a conductive adhesive, so that the connection is effected via the adhesive or the metallic layer.

In accordance with a further embodiment of the present invention, at least the exposed ends of the microparticles are provided with a non-conductive adhesive, and in connecting the pads, the exposed ends of the microparticles are brought into contact and maintained in contact with the opposite pad by means of the non-conductive adhesive.

In accordance with the present invention, and in accordance with an embodiment, the microparticles are so-called carbon nanotubes (nanotubes) having a length in the range from about 100 $\mu$m to 200 $\mu$m, preferably 150 $\mu$m.

In accordance with a preferred embodiment of the inventive method, the flexible microparticles are applied at the wafer level, i.e. before the individual chips are diced. In this manner a plurality of metal faces may be covered with the microparticles in a simple manner.

If the microparticles are deposited on the pads associated with the devices, they may either be deposited directly on the devices or on a redistribution layer, by means of which the pads of a chip are redistributed in accordance with a predetermined pattern.

BRIEF DESCRIPTION OF THE PREFERRED EMBODIMENTS

Preferred embodiments of the present invention will be explained in more detail below with reference to the accompanying figures, in which.

DESCRIPTION OF THE PREFERRED EMBODIMENTS

Figure 1:
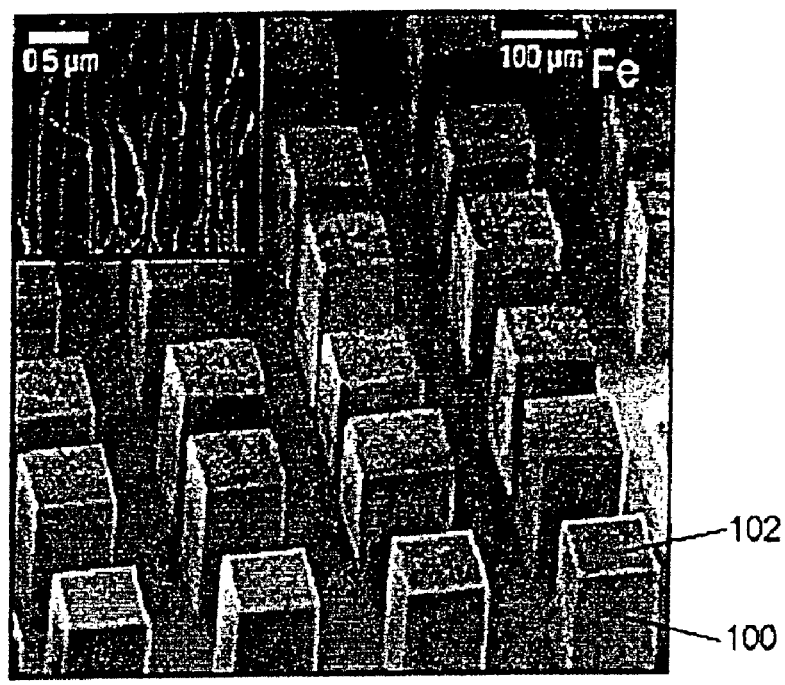
FIG. 1 shows an example of a grown carbon nanotube bundle produced on the pads in accordance with the present invention.

FIG. 1 shows a picture of a grown carbon nanotube bundle. The individual electrically conductive, flexible bundles can easily be seen in FIG. 1. Such a bundle is given the reference numeral 100, for example. A flexible connection to other pads is possible by means of the bundles, which have an essentially square cross-section and a side length of about 100 $\mu$m. The bundles 100 are grown onto a patterned metal face, and a more detailed representation of a cutout section of an exemplary bundle may be seen in the top left-hand area of FIG. 1. As can be seen from this cutout section, the bundle 100 is formed of a plurality of electrically conductive, flexible carbon nanotube fibers or microparticles, the arrangement in the bundles shown leading to a high resistance to fracture of the nanotubes or microparticles.

Figure 2:
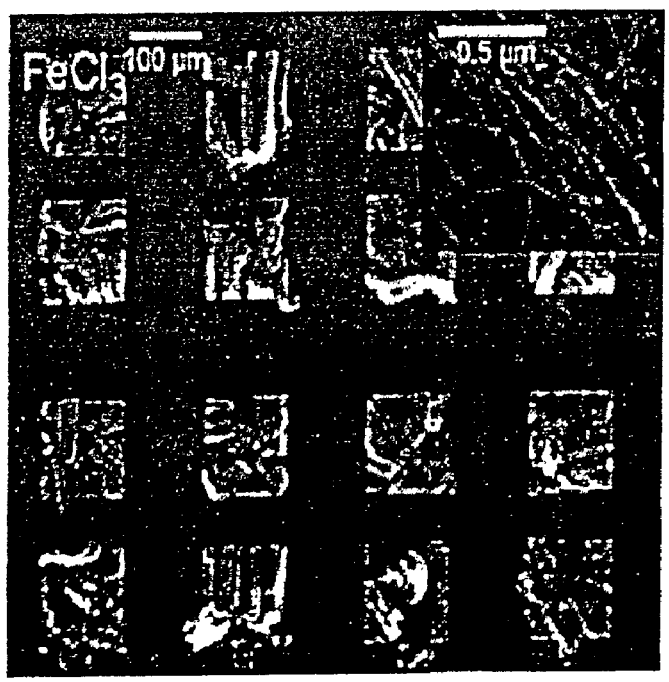
FIG. 2 shows a patterned catalyst for producing the densely packed carbon nanotubes.

FIG. 2 shows the patterned catalyst used for growing the densely packed nanotubes. This growth may be caused on any suitable blank metal alloy.

In accordance with the present invention, an adhesion problem due to a thermal mismatch between two pads is solved by selecting a flexible connection between the components to be connected. An interconnection process which is tried and tested in the macroscopic world, the velcro fastening technique, or the flexible braid technique, wherein a copper braid is used instead of a solid copper wire, is extremely suitable for this. The present invention transfers these known interconnection processes to the microscopic level, in particular to the wafer scale assembly, by making use of nanotubes (conductive flexible microparticles) as connecting links for microscopic contacts. By means of the nanotubes described with reference to FIGS. 1 and 2, cost-intensive processes can be avoided, and, in particular, any thermal mismatch can be compensated for due to the flexibility of a bundle of nanotubes, the elasticity module of an individual nanotube, of an individual particle, being in the range of TPa.

Using nanotubes provides a plurality of advantages which will be explained below.

The nanotubes are highly conductive and can be grown directly onto the metal pads (metal pads, terminal regions) comprising a device, such as a microchip, as the contact surface.

The process duration for the fabrication of the nanotubes as a connector assembly is in the range of a few minutes and may be carried out in parallel on any number of wafers.

The fabrication process for the connector assembly, however, takes place on the complete wafer and may be scaled up as desired, so that, for example, plasma equipment for windowpane coatings may also be used.

A further decisive advantage results from the possibility of being able to remove the microchip again in the event of a malfunction, provided that the chosen connection has provided the nanotubes on both pads so as to create the microscopic velcro fastening. With such a contacting technique, early contacting for chip testing purposes is possible.

A further advantage is that lithographic patterning processes are dispensed with since the nanotubes only grow on the metal faces of the microchip anyway.

The length of the nanotubes is preferably between 100 and 100 $\mu$m, in accordance with a preferred embodiment it is 150 $\mu$m (see FIG. 1), whereby it is ensured that any unevenness to be expected on the board, which may lead to varying spacings between the chip and the board, may be bridged in a flexible manner.

A further advantage of the present invention is that the fuses of the chips are preserved.

In accordance with the present invention, a known connection technique, e.g. velcro fastening, by means of known electrically conductive microfibers, the carbon nanotubes, CNTs, is applied to the field of wafer scale assembly (WSA). In this application, the high conductivity of the fiber is used in a new field, in wafer level package, or wafer scale assembly. The electrical and mechanical advantages of a nanotube fiber bundle here are used for "bonding" microchips.

The contact pads of microchips having diameters of, for example, 70 to 80 $\mu$m may be "grown" with carbon nanotubes by means of a plasma TVD method in the event of a suitable metalization. This leads to an intimate connection of the nanotubes with the metal phase due to the process control selected, and thus ensures minimum contact resistances with regard to the microchip. The grown carbon nanotube bundles serve, for example, as connector assemblies for contacting a chip with a board and/or with a connecting line space or a redistribution layer.

As has already been discussed above, different connecting techniques, which shall be explained again in more detail below, may be realized by using the nanotubes.

A first embodiment of the present invention consists in the fact that the microparticles (nanotubes) are produced both on the pads of a chip and on opposing pads of a support, for example a printed circuit board, which microparticles intermesh in the manner of a velcro fastening as two pads are being connected, whereby a detachable connection is created.

A further embodiment provides, by analogy with braids, for covering at least an exposed part of the nanotubes, which are grown on one of the pads, with a conductive layer, either a metalization or a conductive adhesive, so that in a subsequent connecting step, a solder connection or an adhesive connection is achieved between the pads, which in this case obviously is a non-detachable connection.

Therefor, the plastic fiber feet (the exposed portions of the nanotubes) are metalized by means of a dipping process or a metal coating.

A further embodiment relates to the assembly by means of an adhesion technique, wherein at least the non-conductive ends, referred to by 102, for example, in FIG. 1, are covered, and during the connection the adhesive is cured and shrinks in the process so as to realize a good pressure contact between the pads. Alternatively, instead of covering the exposed ends of the nanoparticles, the adhesive may also be applied to an opposing pad, so that the nanoparticles are then pressed into same, and so that same is cured and shrinks during a subsequent connection, so as to enable the connection just mentioned.

Figure 3:
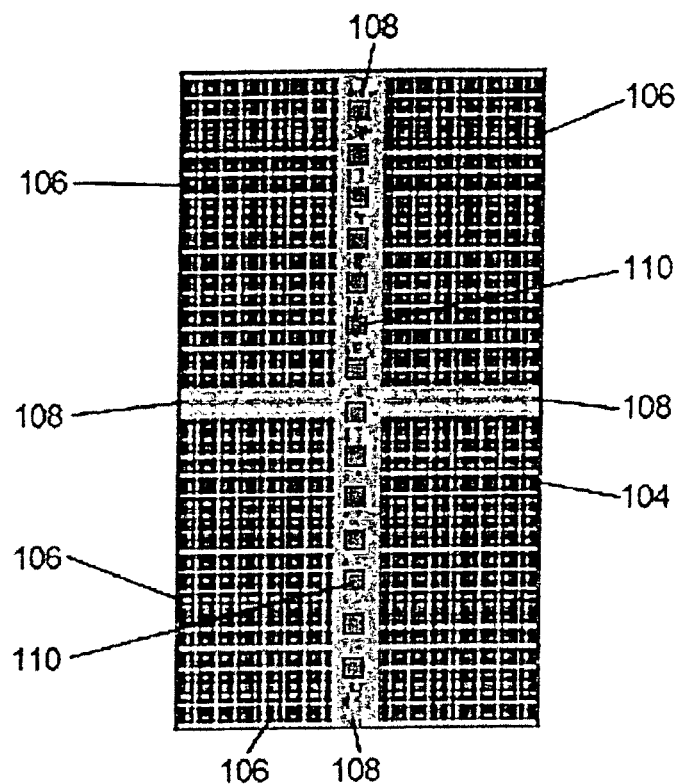
FIG. 3 shows an exemplary representation of a chip with pads.

By way of example, a chip 104 is shown in FIG. 3, for example a memory ship with a plurality of memory regions 106 as well as intervening signal line regions 108, terminal regions 110 being additionally provided in a portion of the signal line region 108, via which terminal regions 110 the chip 104 may be connected to a printed circuit board (board) or another support by means of the connecting techniques just described.

Instead of connecting the chip 104 directly to a board, as described in FIG. 3, a solution is often chosen in which a redistribution layer is provided by means of which the pads 110, which are typically spaced apart fairly closely and which further have small dimensions, are redistributed in accordance with any desired geometry, and by means of which the pad areas of the redistributed pads are increased at the same time.

Figure 4:
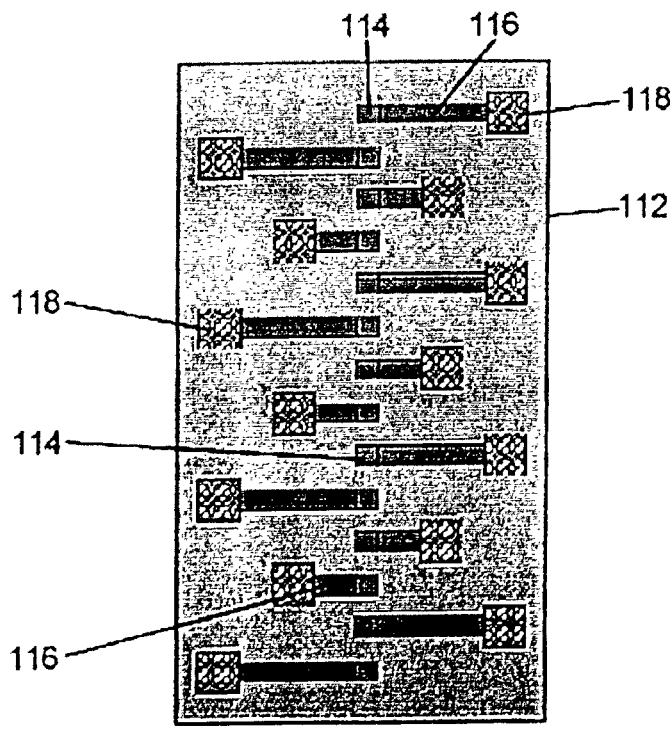
FIG. 4 shows an exemplary representation of a redistribution layer associated, for example, with the chip of FIG. 3.

FIG. 4 shows an example of a redistribution layer 112 provided for being used with the chip of FIG. 3 and comprising a plurality of through connections 114 by means of which the pads 110 may be contacted on the chip 104. The redistribution layer 112 includes a plurality of conductor lines 116 establishing a connection between the through-connection 114 and individual pads 118. The pad 118 and the conductor line 116 are designed in accordance with a predetermined geometry which is freely selectable by a user. As can be seen, the area of the pad 118 is larger than the area of the pad 110 on the chip.

While the chip of FIG. 3 allows nanotubes to be grown in case a required adjustment accuracy is met, this is ensured in the redistribution layer shown in FIG. 4, since due to the re-dimensioning a mechanical stop adjustment is made possible in growing the nanotubes.

If the redistribution layer described in FIG. 4 is used, the microparticles are not directly applied to the pads of the chip 110, as has been mentioned, but to the pads 118 of the redistribution layer. Apart from that, the same connecting possibilities as have been mentioned and explained below are given.

In connection with the redistribution layer it shall be stated that hereby additional costs may be saved since a chip test run may be dispensed with. The test run on the chip, "on-chip", before housing same in accordance with conventional technology is dispensed with if a region in which the fuse block is situated is left blank on the redistribution layer so as to access the fuses of the chip by means of the redistribution layer. Then there is the possibility of "shooting" the fuses in a selective manner i.e. to subsequently redistribute the chip so as to readdress defect regions. Thus the fuses do not become inaccessible on account of the redistribution layer.

What is claimed is:

1. A method of connecting a device to a support, the device having at least a first pad and at least a device pad, the support having at least a second pad, the method comprising:

producing a plurality of electrically conductive, flexible microparticles on the first pad and the second pad; and connecting the first pad and the second pad via the electrically conductive, flexible microparticles by intermeshing the microparticles in the manner of hook and loop fastening upon connecting the first pad and the second pad, to produce a detachable connection; wherein the flexible microparticles are carbon nanotubes; wherein the first pad is arranged in accordance with a geometry differing from an arrangement geometry of the device pad.

2. The method as claimed in claim 1, wherein prior to the connecting step at least the exposed ends of the microparticles are metalized, the connecting step including soldering the pads.

3. The method as claimed in claim 1, wherein prior to the connecting step at least the exposed ends of the microparticles are provided with a conductive adhesive.

4. The method as claimed in claim 1, wherein prior to the connecting step at least the exposed ends of the microparticles are provided with a non-conductive adhesive, and wherein, during the connecting step, the adhesive is cured such that the adhesive shrinks so that an electrical and mechanical connection is produced.

5. The method as claimed in claim 1, wherein the electrically conductive, flexible microparticles having a length of between 100 um and 200 um.

6. The method as claimed in claim 1, wherein a plurality of devices with or without a redistribution layer are provided, the devices being arranged in a wafer, the producing step including producing the electrically conductive, flexible microparticles on all first pads on the wafer, the method further including, prior to connecting, the step of dicing the devices.

7. A method of connecting a device to a support via a redistribution layer arranged on the device, the device including a least a device pad, the redistribution layer including at least a first pad connected to the device pad and the support including at least a second pad, the method comprising:

producing a plurality of electrically conductive, flexible microparticles on the first pad and the second pad;

connecting the first pad and the second pad via the electrically conductive, flexible microparticles by intermeshing the microparticles in the manner of a hook and loop fastening upon connecting the first pad and the second pad, whereby producing a detachable connection; wherein the flexible microparticles are carbon nanotubes; wherein the first pad is arranged in accordance with a geometry differing from an arrangement geometry of the device pad.

8. The method as claimed in claim 7, wherein prior to the connecting step at least the exposed ends of the microparticles are metalized, the connecting step including soldering the pads.

9. The method as claimed in claim 7, wherein prior to the connecting step at least the exposed ends of the microparticles are provided with a conductive adhesive.

10. The method as claimed in claim 7, wherein prior to the connecting step at least the exposed ends of the microparticles are provided with a non-conductive adhesive, and wherein, during the connecting step, the adhesive is cured such that the adhesive shrinks so that an electrical and mechanical connection is produced.

11. The method as claimed in claim 7, wherein the electrically conductive, flexible microparticles having a length of between 100 um and 200 um.

12. A The method as claimed in claim 7, wherein a plurality of devices with or without a redistribution layer are provided, the devices being arranged in a wafer, the producing step including producing the electrically conductive, flexible microparticles on all first pads on the wafer, the method further including, prior to connecting, the step of dicing the devices.

13. The method as claimed in claim 8, wherein the step of metalizing the microparticles includes dipping same into a solder bath or coating same with a metal layer.

14. The method as claimed in claim 9, wherein the connecting step includes compressing the terminal regions.

15. A device to be connected to a support, comprising:

at least a device pad;

at least a first pad to be connected to a second pad of the support, said first pad and the second pad both including a plurality of electrically conductive flexible microparticles disposed thereon; and the microparticles intermeshing in the manner of a hook and loop fastening upon said first pad and the second pad being connected, to produce a detachable connection; wherein the flexible microparticles are carbon nanotubes; wherein the first pad is arranged in accordance with a geometry differing from an arrangement geometry of the device pad.

16. The device according to claim 15, wherein the electrically conductive, flexible microparticles having a length of between 100 um and 200 um.

17. A device to be connected to a support, comprising:

at least one a device pad and an associated redistribution layer, said redistribution layer having at least a first pad connected to a second pad of the support for producing a connection between the device and the support said first pad and the second pad both including a plurality of electrically conductive, flexible microparticles disposed thereon; and the microparticles intermeshing in the manner of a hook and loop fastening upon said first pad and the second pad being connected, to produce a detachable connection; wherein the flexible microparticles are carbon nanotubes; wherein the first pad is arranged in accordance with a geometry differing from an arrangement geometry of the device pad.

18. The device according to claim 17, wherein the electrically conductive, flexible microparticles having a length of between 100 um and 200 um.

* * * * *